United States Patent [19]
Yoshizawa

[11] Patent Number: 5,999,551
[45] Date of Patent: Dec. 7, 1999

[54] OPTICAL TRANSMITTER WITH A TEMPERATURE-COMPENSATING MEANS

[75] Inventor: Nobukazu Yoshizawa, Tokyo, Japan

[73] Assignee: NEC Corporation, Tokyo, Japan

[21] Appl. No.: 09/250,436

[22] Filed: Feb. 16, 1999

[30] Foreign Application Priority Data

Feb. 17, 1998 [JP] Japan .................................. 10-035231

[51] Int. Cl.⁶ ................................................ H01S 3/00
[52] U.S. Cl. ................................................ 372/38; 372/34
[58] Field of Search .......................................... 372/38, 34

[56] References Cited

U.S. PATENT DOCUMENTS

| | | | |
|---|---|---|---|
| 4,243,952 | 1/1981 | Patterson | 372/34 |
| 4,792,957 | 12/1988 | Kollanyi | 372/34 |
| 5,499,258 | 3/1996 | Kawano et al. | 372/34 |
| 5,675,599 | 10/1997 | Abe et al. | 372/38 |
| 5,761,230 | 6/1998 | Oono et al. | 372/38 |

FOREIGN PATENT DOCUMENTS

| | | |
|---|---|---|
| 59-55083 | 3/1984 | Japan . |
| 2-140985 | 4/1990 | Japan . |
| 2-268481 | 11/1990 | Japan . |
| 8-316560 | 11/1996 | Japan . |

*Primary Examiner*—Leon Scott, Jr.
*Attorney, Agent, or Firm*—McGinn & Gibb, P.C.

[57] ABSTRACT

An optical transmitter which employs a laser diode for emitting light has a temperature compensator connected parallel to the laser diode. The temperature compensator controls a drive current supplied to the laser diode such that an emission level of the laser diode is kept constant even when the ambient temperature around the laser diode changes.

6 Claims, 2 Drawing Sheets

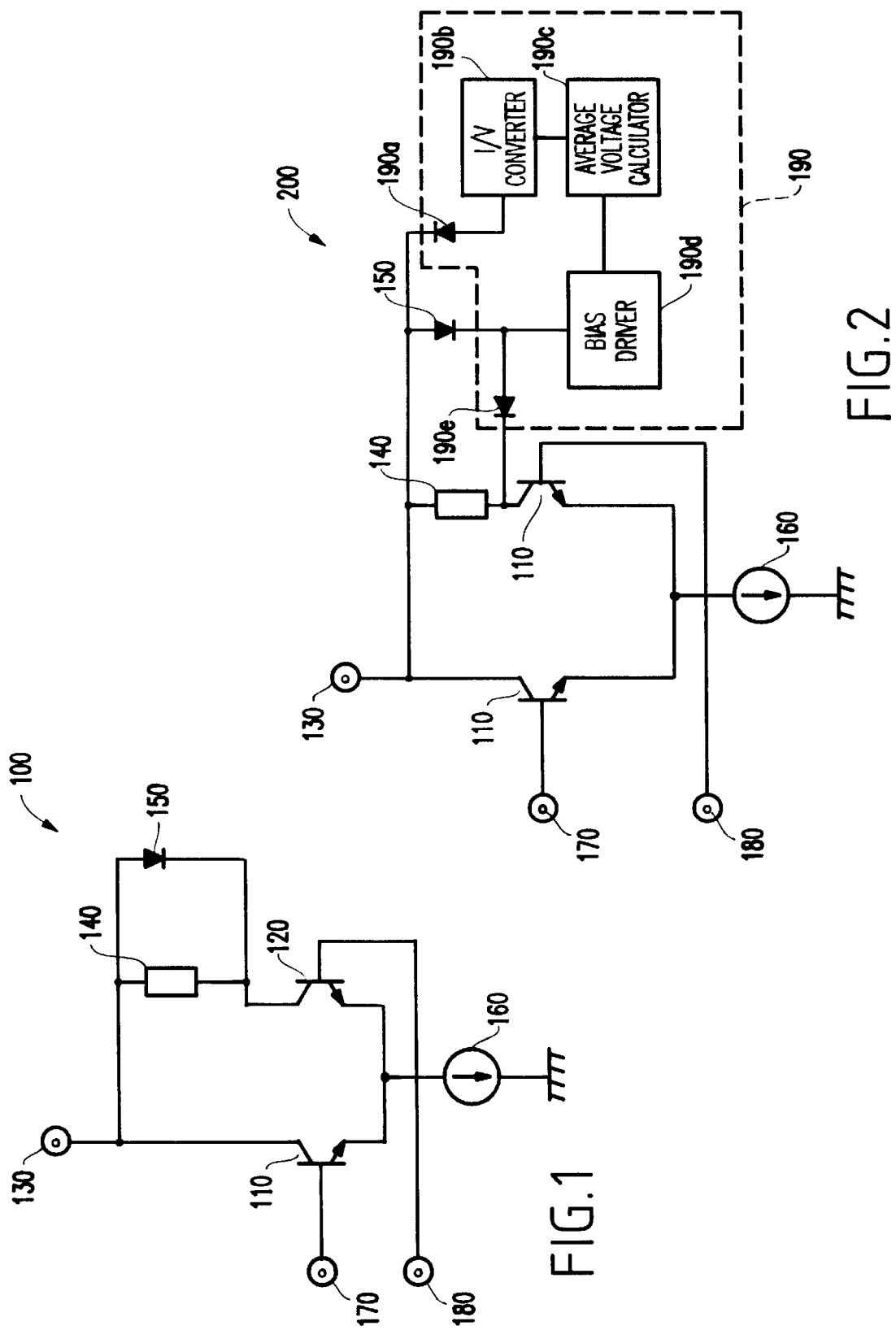

OPTICAL TRANSMITTER WITH A TEMPERATURE-COMPENSATING MEANS

BACKGROUND OF THE INVENTION

1. Field of the Invention

The present invention relates to an optical transmitter which employs a laser diode for emitting light.

2. Description of the Related Art

Laser diodes have their emission efficiency which generally varies with temperature. If a laser diode operates in a narrow temperature range and is associated with an APC (Automatic Power Control) circuit which is capable of correcting a bias current to maintain a desired extinction ratio and waveform duty ratio, then only the APC circuit is sufficient to control the laser diode. However, if the temperature range for a laser diode is too wide for the APC circuit to achieve a desired extinction ratio and waveform duty ratio, then the drive current supplied to the laser diode needs to be corrected depending on the temperature.

Japanese laid-open patent publication No. 7-24055 discloses an optical transmitter having a laser diode whose drive current is controlled by controlling a constant-current source that determines the current of a drive circuit with an APC circuit.

The disclosed optical transmitter, however, is disadvantageous in that when the drive current is varied, the current of the drive circuit has its waveform deteriorated, resulting a deterioration of the waveform of a light signal emitted by the laser diode.

The amount of ringing of the light signal with respect to the drive current is generally constant irrespective of the magnitude of the drive current. The conventional optical transmitter has suffered a problem in that when the ambient temperature around the laser diode drops thereby to lower the drive current supplied to the laser diode, the proportion of ringing in the waveform of the light signal increases.

SUMMARY OF THE INVENTION

It is an object of the present invention to provide an optical transmitter having a laser diode whose emission level remains constant even when the ambient temperature varies and whose light signal ringing does not increase depending on the drive current.

To achieve the above the above object, an optical transmitter in accordance with an aspect of the present invention has a temperature-compensating means connected parallel to a laser diode, for changing a drive current supplied to the laser diode in order to keep an emission level of the laser diode constant even when the ambient temperature around the laser diode changes.

Consequently, even when the emission efficiency of the laser diode changes due to a change in the ambient temperature, the drive current supplied to the laser diode is corrected to keep the emission level of the laser diode constant. Any ringing of the emitted light is prevented from increasing depending on the drive current.

The temperature-compensating means may comprise a thermistor.

According to another aspect of the present invention, the optical transmitter further includes a bias control circuit for supplying a threshold current depending on threshold characteristics of the laser diode as a bias current to the laser diode.

Therefore, changes in the threshold current of the laser diode, i.e., a current flowing when the emission level of the laser diode is almost nil, are corrected.

The bias control circuit may comprise a photodetector for detecting light emitted by the laser diode and converting the detected light into a corresponding emission current, a current-to-voltage converter for converting the emission current from the photodetector into an emission voltage, an average voltage calculator for calculating an average voltage corresponding to the emission current from the emission voltage, a bias driver for supplying a threshold current to the laser diode in order to make the emitted light from the laser diode constant in level, based on the average voltage, and a diode for preventing the threshold current from flowing into the thermistor.

The above and other objects, features and advantages of the present invention will become apparent from the following description with reference to the accompanying drawings which illustrate examples of the present invention.

BRIEF DESCRIPTION OF THE DRAWINGS

FIG. 1 is a circuit diagram of an optical transmitter according to a first embodiment of the present invention;

FIG. 2 is a circuit diagram of an optical transmitter according to a second embodiment of the present invention;

DETAILED DESCRIPTION OF THE PREFERRED EMBODIMENTS

Figure 3:
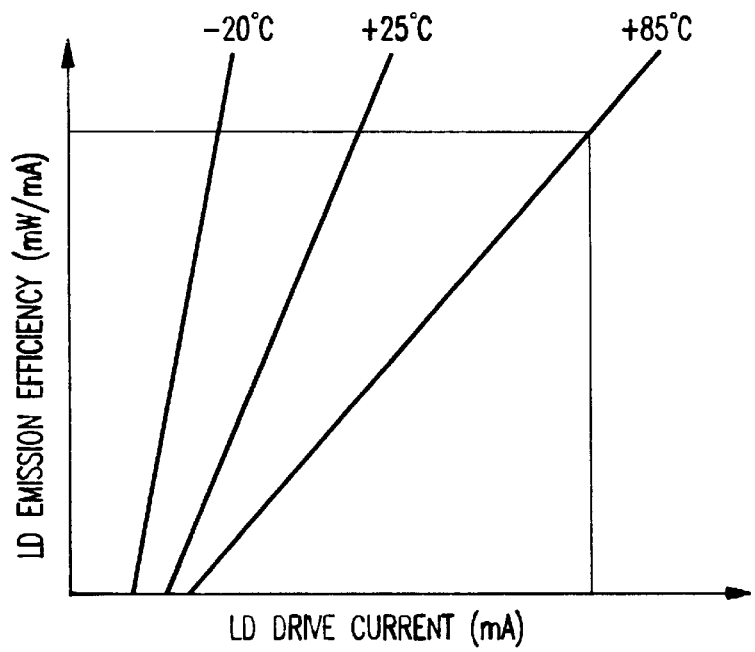
FIG. 3 is a diagram of emission characteristics of a laser diode in the optical transmitter shown in FIG. 1.

Referring now to FIG. 1, there is shown an optical transmitter, generally designated by the reference numeral 100, according to a first embodiment of the present invention.

As shown in FIG. 1, the optical transmitter 100 comprises a pair of transistors 110, 120, a power supply 130, a thermistor 140, a laser diode 150, a constant-current source 160, and a pair of signal input terminals 170, 180.

The transistors 110, 120 have respective emitters connected in common to the constant-current source 160 and respective bases connected to the signal input terminals 170, 180, and serve as a differential amplifier. The signal input terminals 170, 180 are supplied with respective input signals that are complementary to each other. The thermistor 140 and the laser diode 150 are connected parallel to each other between the power supply 130, which is connected to the collector of the transistor 110, and the collector of the transistor 120. The constant-current source 160 is connected between the emitters of the transistors 110, 120 and ground.

The optical transmitter 100 operates as follows: When the transistor 120 is turned on, a current I determined by the constant-current source 160 flows through the parallel-connected circuit of the thermistor 140 and the laser diode 150. A drive current Id flowing through the laser diode 150 is expressed by the following equation (1):

$$Id = I \times Zth/(Zld + Zth) \quad (1)$$

where Zld represents the impedance of the laser diode 150 and Zth represents the impedance of the thermistor 140.

It can be seen from the equation (1) that as the impedance Zth of the thermistor 140 increases, the drive current Id flowing through the laser diode 150 increases.

When the ambient temperature around the laser diode 150 increases, the emission efficiency of the laser diode 150 decreases, as shown in FIG. 3. At this time, as shown in FIG.

4, the impedance Zth of the thermistor 140 increases, resulting in an increase in the drive current Id flowing through the laser diode 150.

Figure 4:
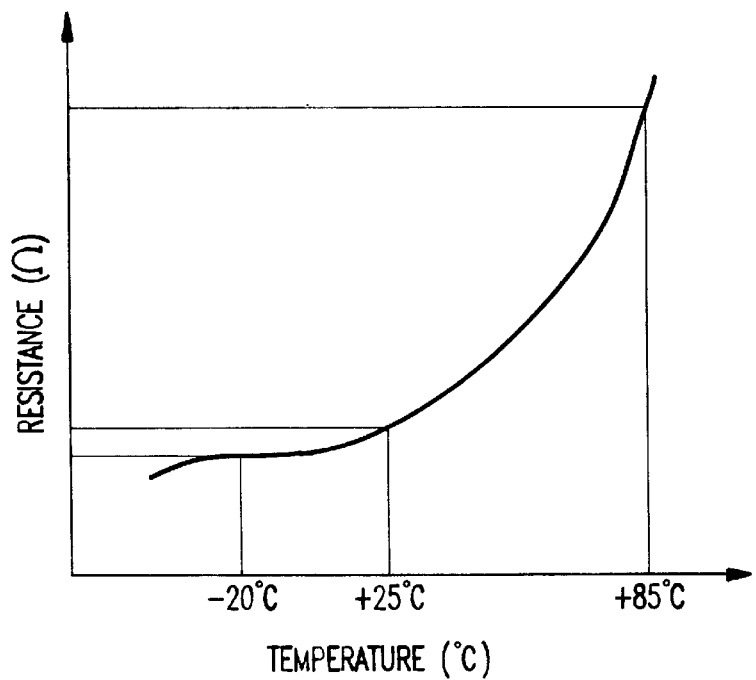
FIG. 4 is a diagram of temperature characteristics of a thermistor in the optical transmitter shown in FIG. 1.

When the ambient temperature around the thermistor 140 and the laser diode 150 decreases, the emission efficiency of the laser diode 150 increases, as shown in FIG. 3. At this time, as shown in FIG. 4, the impedance Zth of the thermistor 140 decreases, resulting in a decrease in the drive current Id flowing through the laser diode 150.

Therefore, a thermistor having such temperature characteristics that the drive current Id at each temperature with respect to a desired emission efficiency of the laser diode 150 satisfies the above equation (1) is selected as the thermistor 140, so that the emission level of the laser diode 150 remains unchanged even when the ambient temperature changes.

Referring to FIG. 2, there is shown an optical transmitter, generally designated by the reference numeral 200, according to a second embodiment of the present invention. The optical transmitter 200 shown in FIG. 2 differs from the optical transmitter 100 shown in FIG. 1 in that it additionally has a bias control circuit 190. Those parts of the optical transmitter 200 which are identical to those of the optical transmitter 100 are denoted by identical reference characters, and will not be described in detail below.

As shown in FIG. 2, the bias control circuit 190 comprises a photodetector 190a for detecting light emitted by the laser diode 150 and converting the detected light into a corresponding emission current, a current-to-voltage (I/V) converter 190b for converting an emission current from the photodetector 190a into an emission voltage, an average voltage calculator 190c for calculating an average voltage corresponding to the emission current from the emission voltage, a bias driver 190d for supplying a threshold current, which depends on threshold characteristics of the laser diode 150, as a bias current to the laser diode 150 in order to make the emitted light from the laser diode 150 constant in level, based on the average voltage calculated by the average voltage calculator 190c, and a diode 190e for preventing the threshold current outputted from the bias driver 190d to the cathode of the laser diode 150 from flowing into the thermistor 140.

If the impedance of the diode 190e is represented by Zd, then a drive current Id flowing through the laser diode 150 is expressed by the following equation (2):

$$Id = I \times Zth/(Zld + Zd + Zth) \quad (2)$$

It can be understood from the equation (2) that as the impedance Zth of the thermistor 140 increases, the drive current Id flowing through the laser diode 150 increases.

Therefore, as with the first embodiment, a thermistor having such temperature characteristics that the drive current Id at each temperature with respect to a desired emission efficiency of the laser diode 150 satisfies the above equation (2) is selected as the thermistor 140, so that the emission level of the laser diode 150 remains unchanged even when the ambient temperature changes.

In the bias control circuit 190, the photodetector 190a converts the light emitted by the laser diode 150 into a photocurrent, and the I/V converter 190b converts the photocurrent into a corresponding voltage. The average voltage calculator 190c calculates an average voltage corresponding to the photocurrent from the photodetector 190a, from the voltage produced by the I/V converter 190b, and controls the threshold current generated by the bias driver 190d to make the emitted light from the laser diode 150 constant in level. The bias control circuit 190 which operates in the manner described above serves as a so-called APC circuit.

While preferred embodiments of the present invention have been described using specific terms, such description is for illustrative purposes only, and it is to be understood that changes and variations may be made without departing from the spirit or scope of the following claims.

What is claimed is:

1. An optical transmitter comprising;
    a laser diode connected between a high-potential power supply and a lower-potential power supply;
    a constant-current source connected in series with said laser diode, for supplying a drive current to said laser diode;
    temperature-compensating means connected parallel to said laser diode, for changing said drive current in order to keep an emission level of said laser diode constant irrespective of changes in an ambient temperature around said laser diode; and
    constant-current source control means for selectively turning on and off the supply of said drive current from said constant-current source to said laser diode.

2. An optical transmitter according to claim 1, wherein said temperature-compensating means comprises a thermistor having a resistance variable depending on an ambient temperature therearound in order to determine said drive current to maintain the emission level of said laser diode, which is determined by temperature characteristics of emission efficiency of said laser diode, at a predetermined value.

3. An optical transmitter according to claim 2, further comprising a bias control circuit for supplying a threshold current depending on threshold characteristics of said laser diode as a bias current to said laser diode.

4. An optical transmitter according to claim 3, wherein said bias control circuit comprises:
    a photodetector for detecting light emitted by said laser diode and converting the detected light into a corresponding emission current;
    a current-to-voltage converter for converting the emission current from said photodetector into an emission voltage;
    an average voltage calculator for calculating an average voltage corresponding to said emission current from said emission voltage;
    a bias driver for supplying a threshold current to said laser diode in order to make the emitted light from said laser diode constant in level, based on said average voltage; and
    a diode for preventing said threshold current from flowing into said thermistor.

5. An optical transmitter according to claim 1, further comprising a bias control circuit for supplying a threshold current depending on threshold characteristics of said laser diode as a bias current to said laser diode.

6. An optical transmitter according to claim 5, wherein said bias control circuit comprises:
    a photodetector for detecting light emitted by said laser diode and converting the detected light into a corresponding emission current;
    a current-to-voltage converter for converting the emission current from said photodetector into an emission voltage;
    an average voltage calculator for calculating an average voltage corresponding to said emission current from said emission voltage;
    a bias driver for supplying a threshold current to said laser diode in order to make the emitted light from said laser diode constant in level, based on said average voltage; and
    a diode for preventing said threshold current from flowing into said thermistor.

* * * * *